(12) United States Patent
Wu et al.

(10) Patent No.: US 11,832,407 B2
(45) Date of Patent: Nov. 28, 2023

(54) SUPPORT FRAME AND DISPLAY DEVICE

(71) Applicant: QISDA CORPORATION, Taoyuan (TW)

(72) Inventors: Shin-Hao Wu, Taoyuan (TW); Han-Kuang Ho, Taoyuan (TW); Hsin-Hung Lin, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 273 days.

(21) Appl. No.: 17/131,774

(22) Filed: Dec. 23, 2020

(65) Prior Publication Data

US 2021/0227710 A1    Jul. 22, 2021

(30) Foreign Application Priority Data

Jan. 21, 2020   (TW) .................................. 109102150

(51) Int. Cl.
| | | |
|---|---|---|
| H05K 5/02 | (2006.01) | |
| H05K 5/00 | (2006.01) | |
| F16C 29/04 | (2006.01) | |
| F16M 11/04 | (2006.01) | |

(52) U.S. Cl.
CPC ........... *H05K 5/0234* (2013.01); *F16C 29/04* (2013.01); *F16M 11/046* (2013.01); *H05K 5/0017* (2013.01); *F16M 2200/025* (2013.01)

(58) Field of Classification Search
None
See application file for complete search history.

(56) References Cited

U.S. PATENT DOCUMENTS

| | | | | |
|---|---|---|---|---|
| 5,763,965 | A * | 6/1998 | Bader | F16C 29/04 310/13 |
| 2005/0284991 | A1 * | 12/2005 | Saez | F16M 11/2014 248/122.1 |
| 2012/0119593 | A1 * | 5/2012 | Yajima | H02K 41/031 310/12.21 |
| 2017/0219158 | A1 * | 8/2017 | Chin | F16M 11/2014 |
| 2018/0045361 | A1 * | 2/2018 | Hsu | F16M 11/10 |
| 2018/0363836 | A1 * | 12/2018 | Yen | F16M 13/02 |

FOREIGN PATENT DOCUMENTS

| | | | |
|---|---|---|---|
| CN | 206545761 U | * | 10/2017 |
| CN | 107387970 A | | 11/2017 |
| CN | 107543013 A | * | 1/2018 |
| CN | 208350382 U | | 1/2019 |
| CN | 209511452 U | | 10/2019 |

* cited by examiner

*Primary Examiner* — James Wu
*Assistant Examiner* — Christopher L Augustin

(57) ABSTRACT

A support frame includes a frame body and a sliding module. The frame body has a first guiding rail and a second guiding rail, wherein the first guiding rail is opposite to the second guiding rail and the first guiding rail is made of a magnetic induction material. The sliding module is slidably disposed on the frame body. The sliding module includes a plurality of first spherical bodies and a plurality of second spherical bodies, wherein the first spherical bodies rotatably abut against the first guiding rail, the second spherical bodies rotatably abut against the second guiding rail, and at least one of the first spherical bodies is a magnetic ball.

16 Claims, 8 Drawing Sheets

SUPPORT FRAME AND DISPLAY DEVICE

BACKGROUND OF THE INVENTION

1. Field of the Invention

The invention relates to a support frame and a display device and, more particularly, to a support frame with simplified structure and a display device equipped with the support frame.

2. Description of the Prior Art

In general, a display device is equipped with a support frame, such that the display device can be placed on a plane by the support frame. At present, some support frames have a lift structure allowing a user to adjust a height of a display unit disposed on the support frame. However, the lift structure of the conventional support frame consists of various components, such that the assembly process of the support frame is complicated and the assembly efficiency cannot be improved effectively. Furthermore, lots of components may increase the manufacturing cost of the display device.

SUMMARY OF THE INVENTION

An objective of the invention is to provide a support frame with simplified structure and a display device equipped with the support frame, so as to solve the aforesaid problems.

According to an embodiment of the invention, a support frame comprises a frame body and a sliding module. The frame body has a first guiding rail and a second guiding rail, wherein the first guiding rail is opposite to the second guiding rail and the first guiding rail is made of a magnetic induction material. The sliding module is slidably disposed on the frame body. The sliding module comprises a plurality of first spherical bodies and a plurality of second spherical bodies, wherein the first spherical bodies rotatably abut against the first guiding rail, the second spherical bodies rotatably abut against the second guiding rail, and at least one of the first spherical bodies is a magnetic ball.

According to another embodiment of the invention, a display device comprises a support frame and a display unit. The support frame comprises a frame body and a sliding module. The frame body has a first guiding rail and a second guiding rail, wherein the first guiding rail is opposite to the second guiding rail and the first guiding rail is made of a magnetic induction material. The sliding module is slidably disposed on the frame body. The sliding module comprises a plurality of first spherical bodies and a plurality of second spherical bodies, wherein the first spherical bodies rotatably abut against the first guiding rail, the second spherical bodies rotatably abut against the second guiding rail, and at least one of the first spherical bodies is a magnetic ball. The display unit is disposed on the sliding module.

As mentioned in the above, the invention utilizes the magnetic ball to attract the guiding rail, so as to position the sliding module on the frame body. Furthermore, the sliding module can slide with respect to the frame body by rotation of the spherical bodies, so as to achieve lift function. Since the spherical bodies at opposite sides of the sliding module abut against the guiding rails at opposite sides of the frame body, the invention can keep the sliding module at a position along vertical direction stably. Moreover, since the contact between each spherical body and the guiding rail is point contact, a manufacturing tolerance can be absorbed effectively, such that there is no gap between each spherical body and the guiding rail. Accordingly, a user may get good sliding feeling. Since the structure of the invention is simple, the invention can improve the assembly efficiency of the support frame and reduce the manufacturing cost of the display device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
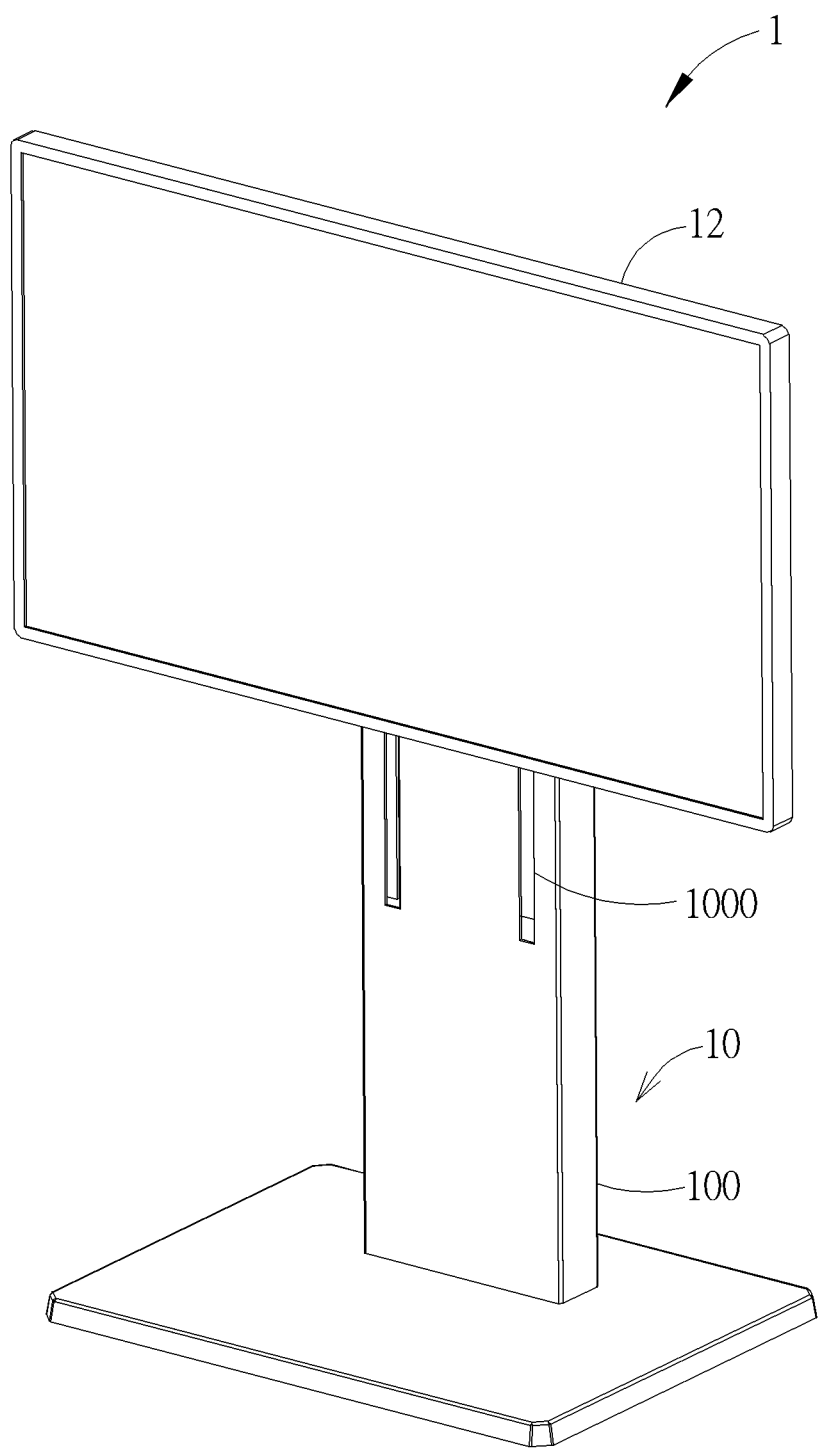
FIG. 1 is a perspective view illustrating a display device according to an embodiment of the invention.
Figure 2:
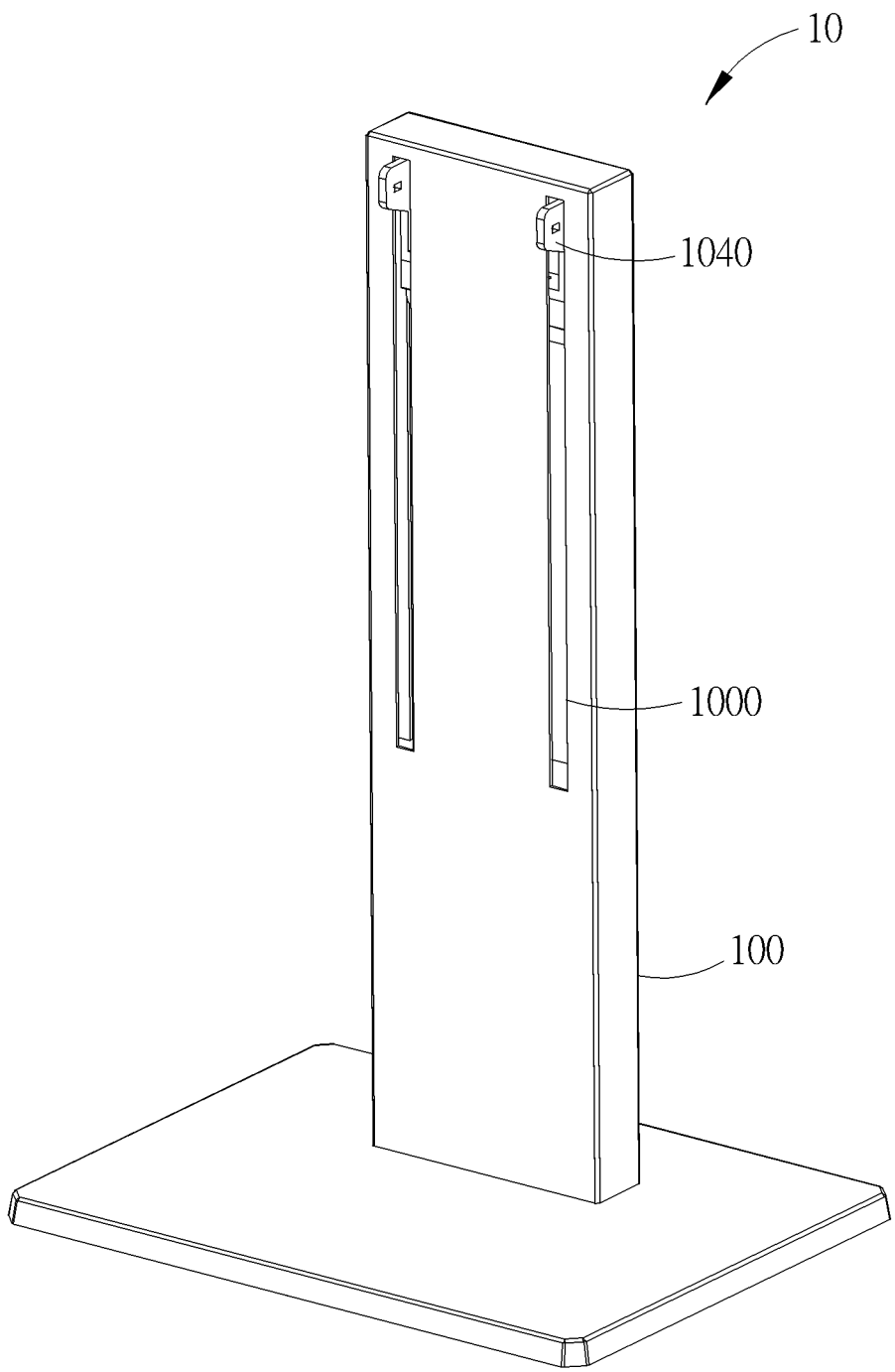
FIG. 2 is a perspective view illustrating the support frame shown in FIG. 1.
Figure 3:
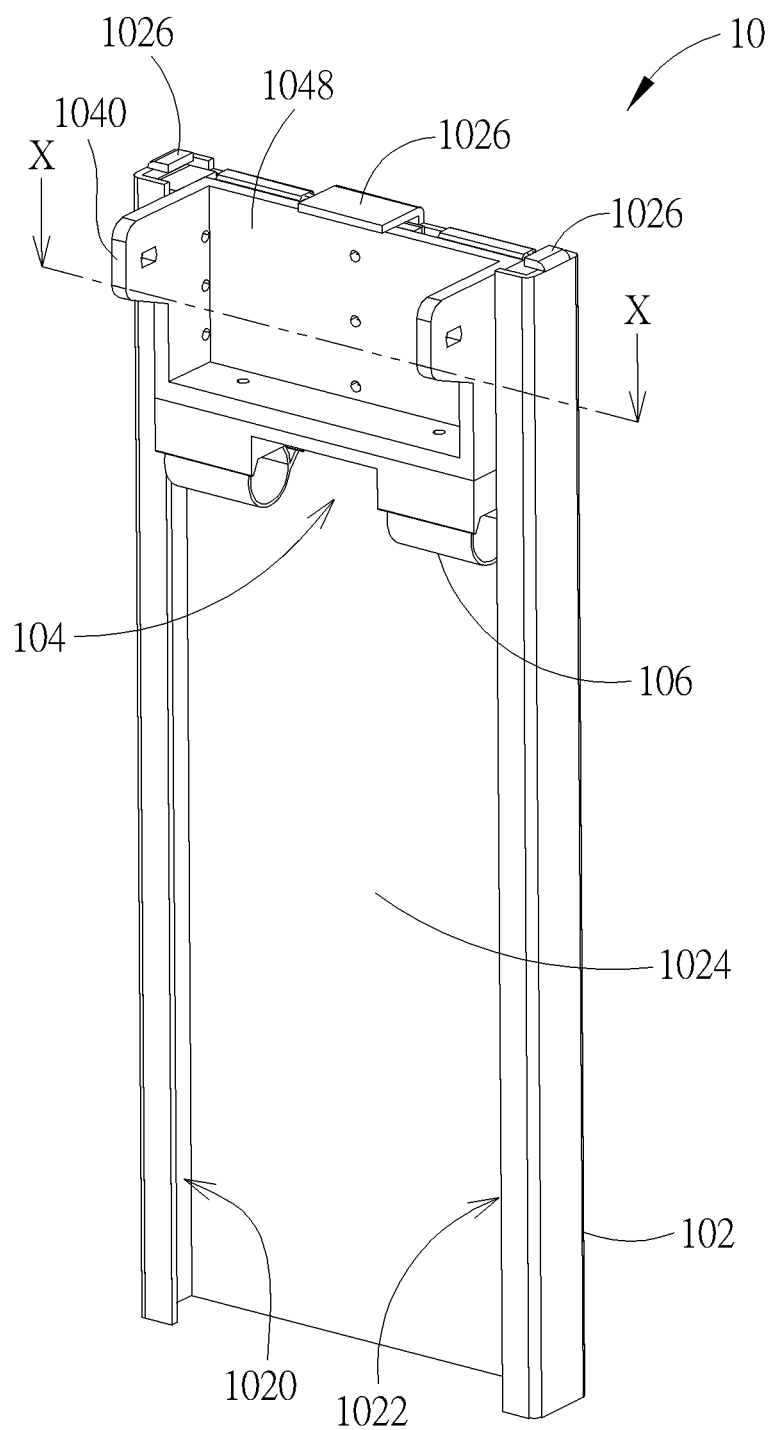
FIG. 3 is a perspective view illustrating the inside of the support frame shown in FIG. 2.
Figure 4:
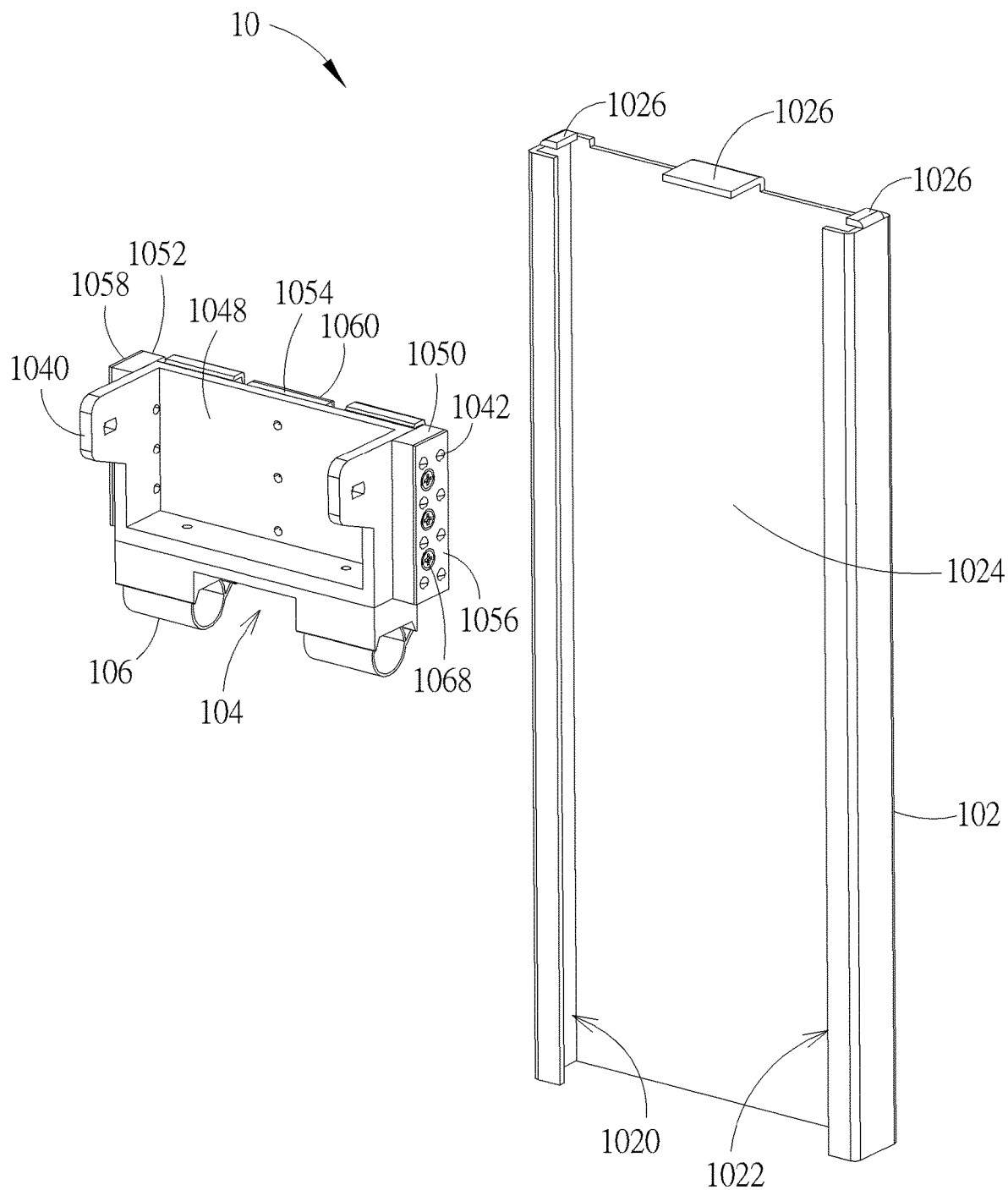
FIG. 4 is an exploded view illustrating the support frame shown in FIG. 3.
Figure 5:
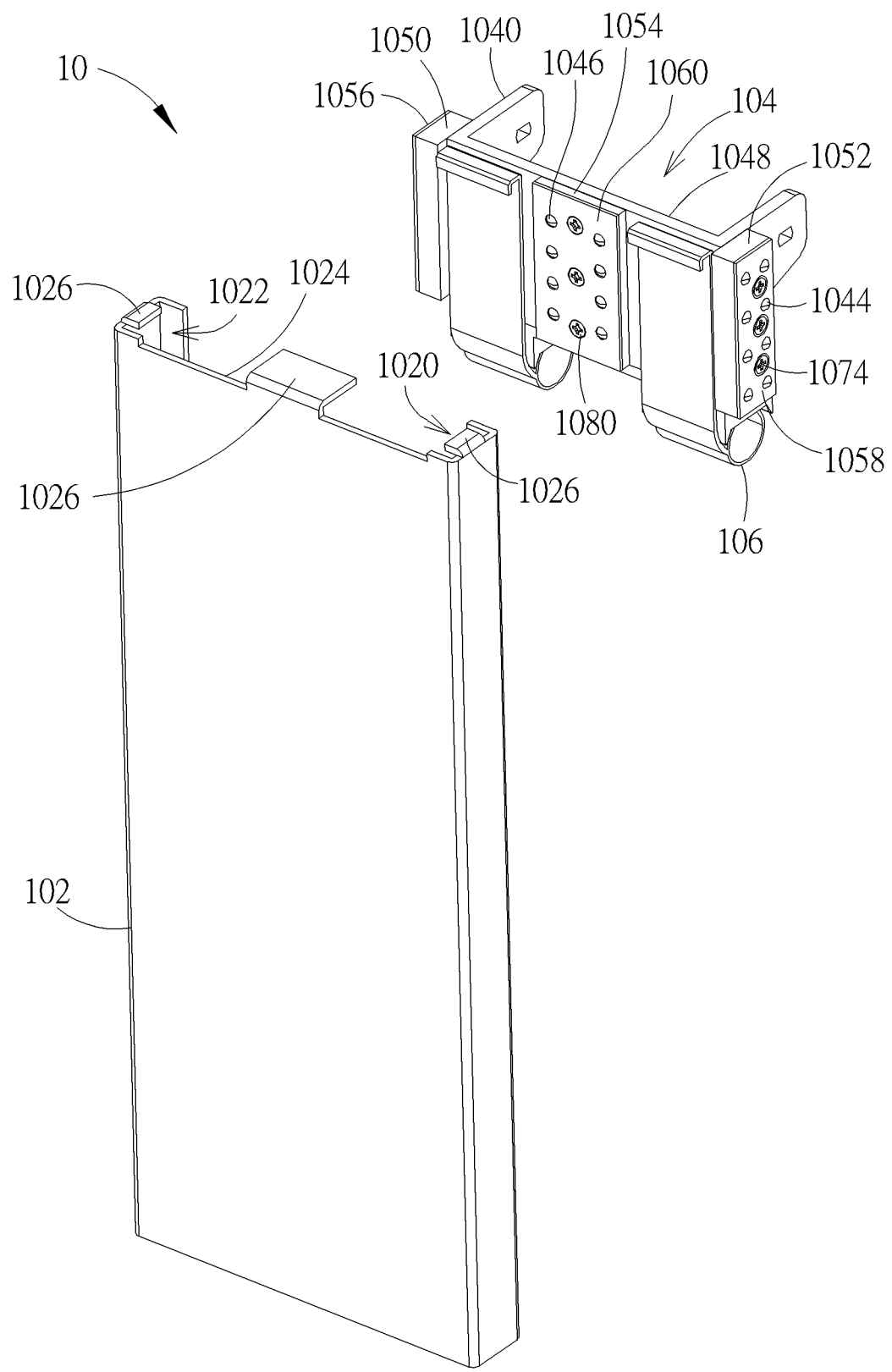
FIG. 5 is an exploded view illustrating the support frame shown in FIG. 3 from another viewing angle.
Figure 6:
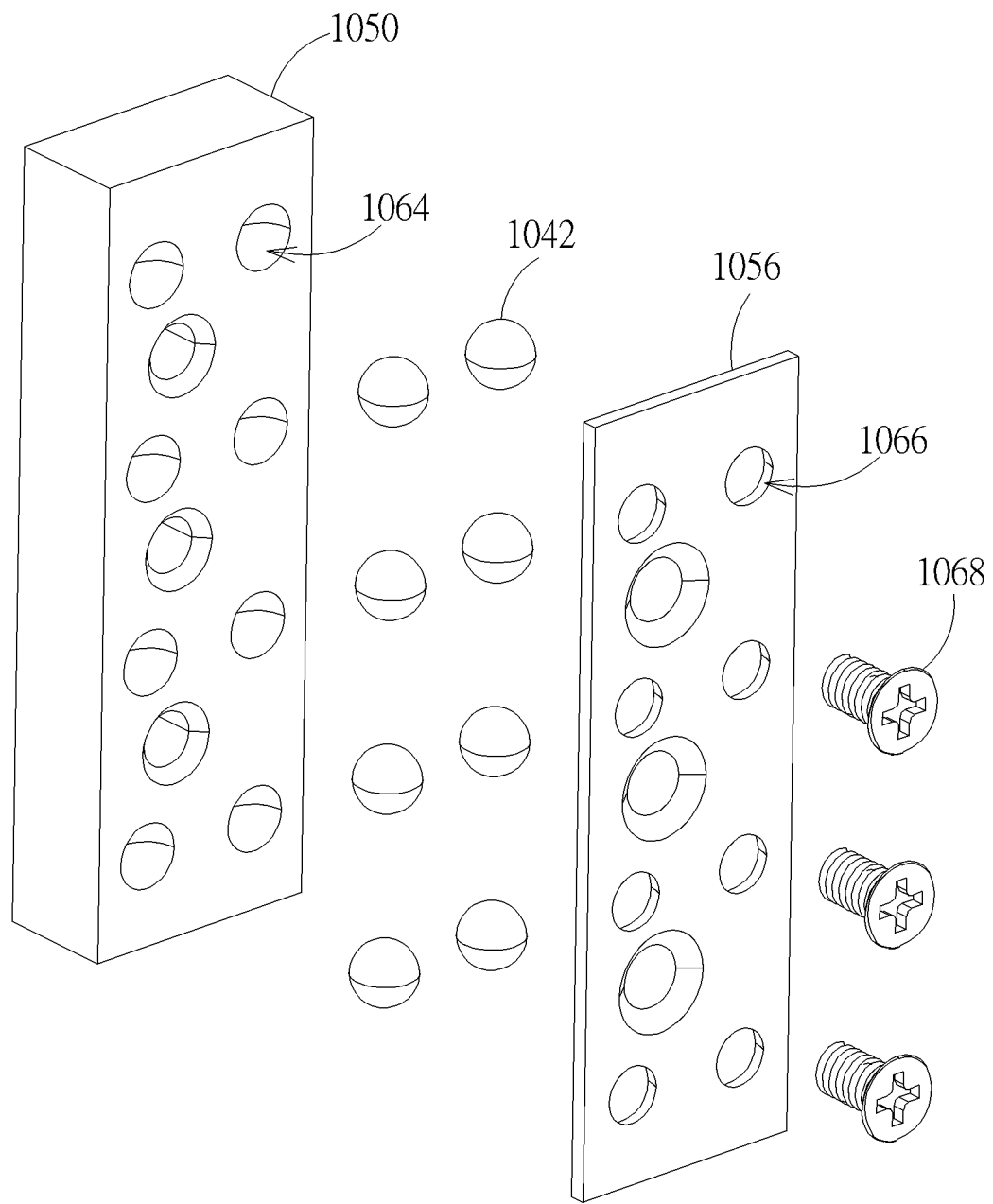
FIG. 6 is an exploded view illustrating the first spherical bodies, the first fixing member and the first cover shown in FIG. 4.
Figure 7:
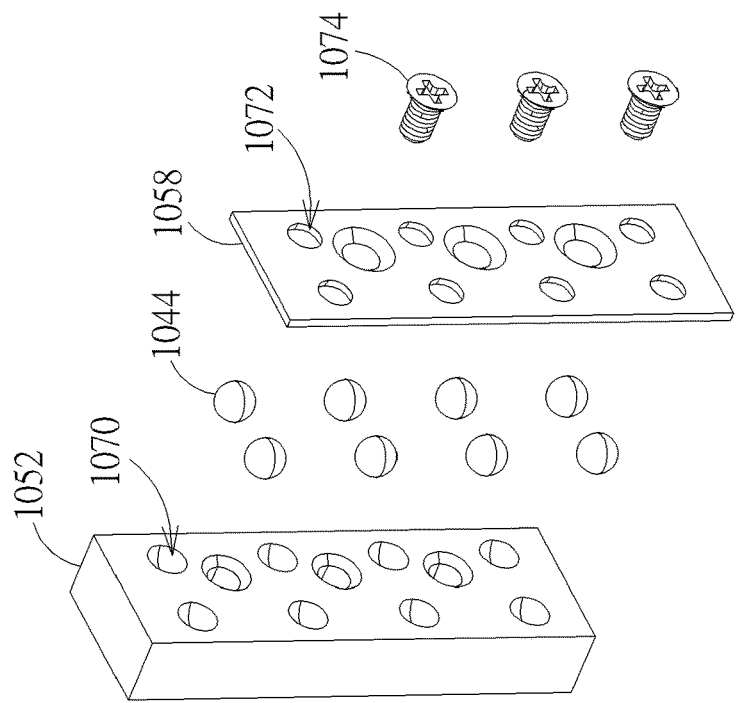
FIG. 7 is an exploded view illustrating the second spherical bodies, the second fixing member, the second cover, the third spherical bodies, the third fixing member and the third cover shown in FIG. 5.
Figure 7:
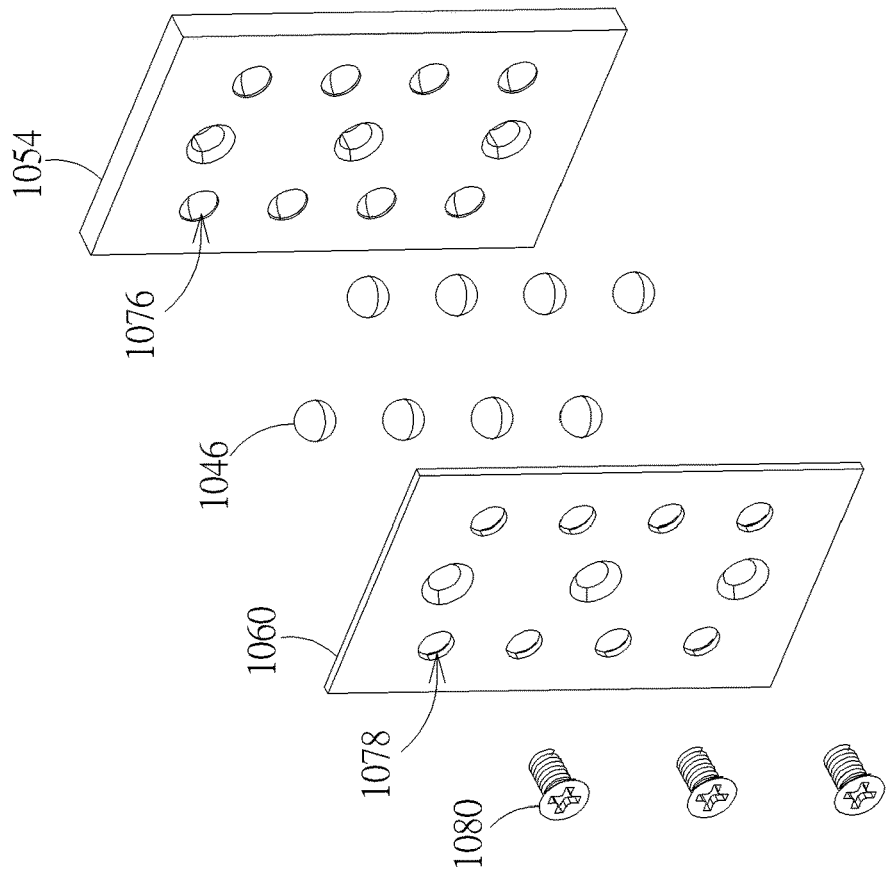
Figure 8:
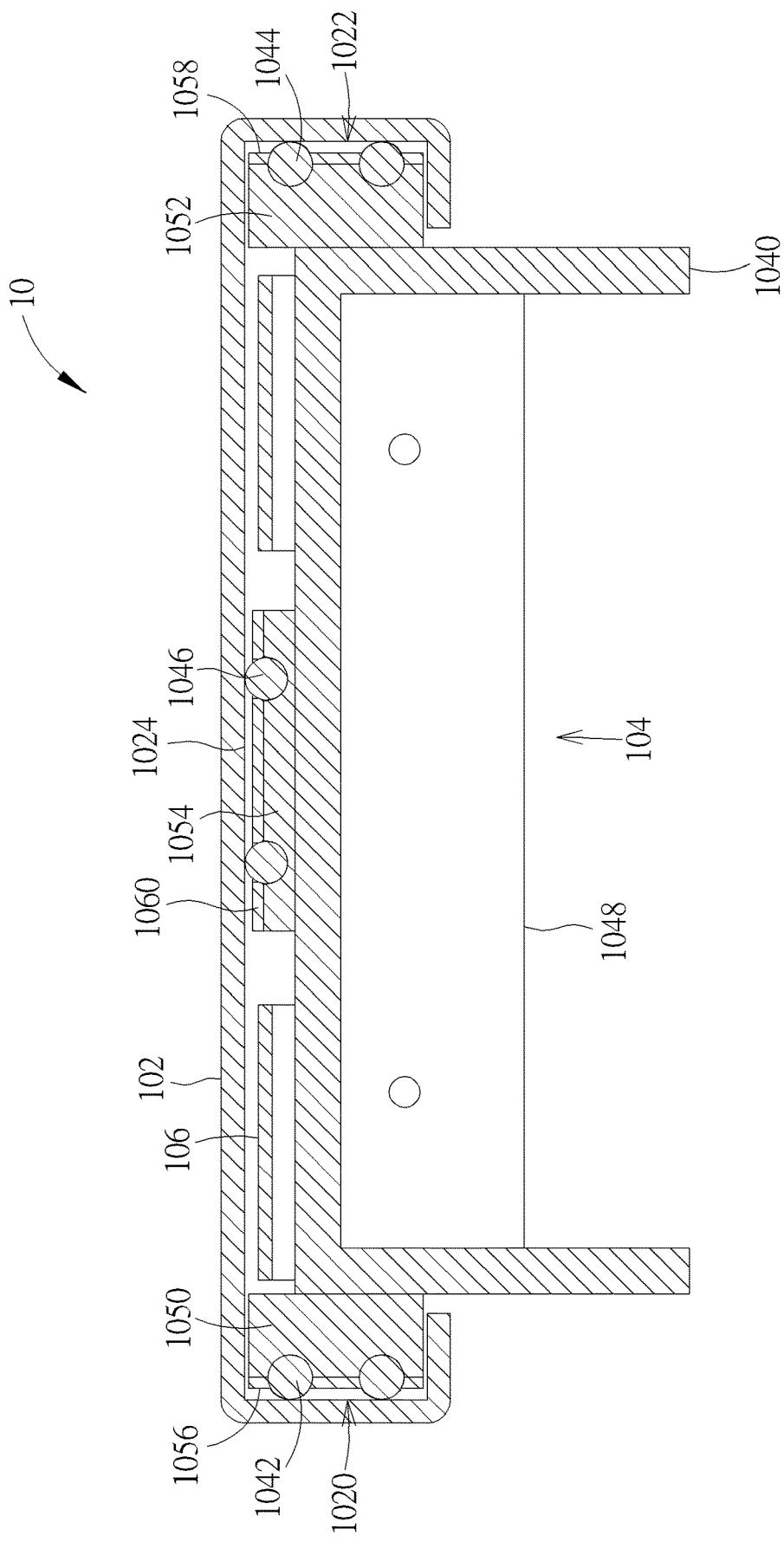
FIG. 8 is a sectional view illustrating the support frame shown in FIG. 3.

Referring to FIGS. 1 to 8, FIG. 1 is a perspective view illustrating a display device 1 according to an embodiment of the invention, FIG. 2 is a perspective view illustrating the support frame 10 shown in FIG. 1, FIG. 3 is a perspective view illustrating the inside of the support frame 10 shown in FIG. 2, FIG. 4 is an exploded view illustrating the support frame 10 shown in FIG. 3, FIG. 5 is an exploded view illustrating the support frame 10 shown in FIG. 3 from another viewing angle, FIG. 6 is an exploded view illustrating the first spherical bodies 1042, the first fixing member 1050 and the first cover 1056 shown in FIG. 4, FIG. 7 is an exploded view illustrating the second spherical bodies 1044, the second fixing member 1052, the second cover 1058, the third spherical bodies 1046, the third fixing member 1054 and the third cover 1060 shown in FIG. 5, and FIG. 8 is a sectional view illustrating the support frame 10 shown in FIG. 3 along line X-X.

As shown in FIG. 1, the display device 1 comprises a support frame 10 and a display unit 12, wherein the display unit 12 is disposed on the support frame 10. In practical applications, the display unit 12 may be disposed on the support frame 10 by a hinge. In this embodiment, the display unit 12 may be, but not limited to, a display (e.g. liquid crystal display, plasma display, organic light emitting diode display and so on. In another embodiment, the display unit 12 may also be replaced by other objects disposed on the support frame 10. In other words, the support frame 10 is not limited to cooperate with the display unit 12 to form the display device 1.

As shown in FIGS. 2 and 3, the support frame 10 comprises a base 100, a frame body 102 and a sliding module 104, wherein the frame body 102 and the sliding module 104 are disposed in the base 100 and the sliding module 104 is slidably disposed on the frame body 102. In this embodiment, the base 100 may have two longitudinal grooves, such that two connecting portions 1040 of the sliding module 104 may protrude from the two longitudinal grooves 1000. The display unit 12 may be connected to the two connecting portions 1040, so as to be disposed on the sliding module 104. Accordingly, the display unit 12 may drive the sliding module 104 to slide along the longitudinal grooves 1000 to achieve lift function.

As shown in FIGS. 3 to 5, the frame body 102 has a first guiding rail 1020 and a second guiding rail 1022, wherein the first guiding rail 1020 is opposite to the second guiding rail 1022. Furthermore, the sliding module 104 comprises a plurality of first spherical bodies 1042, a plurality of second spherical bodies 1044, a plurality of third spherical bodies 1046, a sliding member 1048, a first fixing member 1050, a second fixing member 1052, a third fixing member 1054, a first cover 1056, a second cover 1058 and a third cover 1060. In this embodiment, the first fixing member 1050 and the second fixing member 1052 may be disposed at opposite sides of the sliding member 1048 and the third fixing member 1054 may be disposed between the first fixing member 1050 and the second fixing member 1052. In this embodiment, the first fixing member 1050, the second fixing member 1052 and the third fixing member 1054 may be made of, but not limited to, polyoxymethylene (POM). In another embodiment, the first fixing member 1050, the second fixing member 1052 and the third fixing member 1054 may be formed with the sliding member 1048 integrally according to practical applications. Still further, the aforesaid connecting portions 1040 may extend from the sliding member 1048.

The first cover 1056 is disposed on the first fixing member 1050 to position the first spherical bodies 1042 on the first fixing member 1050. As shown in FIG. 6, the first fixing member 1050 may have a plurality of spherical recesses 1064 and the first cover 1056 may have a plurality of holes 1066 corresponding to the spherical recesses 1064. An assembler may dispose the first spherical bodies 1042 in the spherical recesses 1064 of the first fixing member 1050 first and then dispose the first cover 1056 on the first fixing member 1050, such that the first spherical bodies 1042 protrude from the holes 1066 of the first cover 1056. A diameter of the first spherical body 1042 is larger than a diameter of the hole 1066, such that the first spherical body 1042 cannot drop out of the hole 1066. Then, the assembler may use screws 1068 to fix the first cover 1056 on the first fixing member 1050. Accordingly, the first spherical bodies 1042 are rotatably disposed on the first fixing member 1050. It should be noted that the first cover 1056 may also be fixed on the first fixing member 1050 by other manners according to practical applications.

The second cover 1058 is disposed on the second fixing member 1052 to position the second spherical bodies 1044 on the second fixing member 1052. As shown in FIG. 7, the second fixing member 1052 may have a plurality of spherical recesses 1070 and the second cover 1058 may have a plurality of holes 1072 corresponding to the spherical recesses 1070. An assembler may dispose the second spherical bodies 1044 in the spherical recesses 1070 of the second fixing member 1052 first and then dispose the second cover 1058 on the second fixing member 1052, such that the second spherical bodies 1044 protrude from the holes 1072 of the second cover 1058. A diameter of the second spherical body 1044 is larger than a diameter of the hole 1072, such that the second spherical body 1044 cannot drop out of the hole 1072. Then, the assembler may use screws 1074 to fix the second cover 1058 on the second fixing member 1052. Accordingly, the second spherical bodies 1044 are rotatably disposed on the second fixing member 1052. It should be noted that the second cover 1058 may also be fixed on the second fixing member 1052 by other manners according to practical applications.

The third cover 1060 is disposed on the third fixing member 1054 to position the third spherical bodies 1046 on the third fixing member 1054. As shown in FIG. 7, the third fixing member 1054 may have a plurality of spherical recesses 1076 and the third cover 1060 may have a plurality of holes 1078 corresponding to the spherical recesses 1076. An assembler may dispose the third spherical bodies 1046 in the spherical recesses 1076 of the third fixing member 1054 first and then dispose the third cover 1060 on the third fixing member 1054, such that the third spherical bodies 1046 protrude from the holes 1078 of the third cover 1060. A diameter of the third spherical body 1046 is larger than a diameter of the hole 1078, such that the third spherical body 1046 cannot drop out of the hole 1078. Then, the assembler may use screws 1080 to fix the third cover 1060 on the third fixing member 1054. Accordingly, the third spherical bodies 1046 are rotatably disposed on the third fixing member 1054. It should be noted that the third cover 1060 may also be fixed on the third fixing member 1054 by other manners according to practical applications.

As shown in FIGS. 3 and 8, when the sliding module 104 is disposed on the frame body 102, the first fixing member 1050 is slidably disposed in the first guiding rail 1020 and the second fixing member 1052 is slidably disposed in the second guiding rail 1022, such that the first spherical bodies 1042 rotatably abut against the first guiding rail 1020 and the second spherical bodies 1044 rotatably abut against the second guiding rail 1022. Furthermore, the third fixing member 1054 is slidably disposed with respect to a side wall 1024 of the frame body 102, such that the third spherical bodies 1046 rotatably abut against the side wall 1024, wherein the side wall 1024 is located between the first guiding rail 1020 and the second guiding rail 1022. Accordingly, the sliding module 104 can slide with respect to the frame body 102 by rotation of the first spherical bodies 1042, the second spherical bodies 1044 and the third spherical bodies 1046, so as to achieve lift function.

In this embodiment, the first guiding rail 1020 may be made of a magnetic induction material (e.g. iron) and at least one of the first spherical bodies 1042 may be a magnetic ball. Accordingly, the invention may utilize the magnetic ball to attract the first guiding rail 1020, so as to position the sliding module 104 on the frame body 102. In an embodiment, the whole frame body 102 may be made of the magnetic induction material. In another embodiment, only the first guiding rail 1020 may be made of the magnetic induction material and other portions of the frame body 102 may be made of a non-magnetic induction material. Preferably, all of the first spherical bodies 1042 may be magnetic balls to enhance magnetic force.

In another embodiment, the second guiding rail 1022 may also be made of a magnetic induction material and at least one of the second spherical bodies 1044 may also be a magnetic ball. Accordingly, the invention may utilize the magnetic ball to attract the first guiding rail 1020 and the second guiding rail 1022, so as to position the sliding module 104 on the frame body 102 more stably. In an embodiment, the whole frame body 102 may be made of the magnetic induction material. In another embodiment, only the first guiding rail 1020 and the second guiding rail 1022 may be made of the magnetic induction material and other portions of the frame body 102 may be made of a non-magnetic induction material. Preferably, all of the second spherical bodies 1044 may be magnetic balls to enhance magnetic force.

In another embodiment, the side wall 1024 of the frame body 102 may also be made of a magnetic induction material and at least one of the third spherical bodies 1046 may also be a magnetic ball. Accordingly, the invention may utilize the magnetic ball to attract the first guiding rail 1020, the second guiding rail 1022 and the side wall 1024, so as to position the sliding module 104 on the frame body 102 more stably. In an embodiment, the whole frame body 102 may be made of the magnetic induction material. In another embodiment, only the first guiding rail 1020, the second guiding rail 1022 and the side wall 1024 may be made of the magnetic induction material and other portions of the frame body 102 may be made of a non-magnetic induction material. Preferably, all of the third spherical bodies 1046 may be magnetic balls to enhance magnetic force.

In this embodiment, the support frame 10 may further comprise a constant force spring 106. As shown in FIGS. 3 to 5, the support frame 10 may comprise two constant force springs 106, but is not so limited. The number of the constant force springs 106 may be determined according to practical applications. Opposite ends of the constant force spring 106 are fixed on the frame body 102 and the sliding member 1048 of the sliding module 104. Furthermore, the frame body 102 may comprise at least one retaining portion 1026. As shown in FIGS. 3 to 5, the frame body 102 may comprise three retaining portions 1026, but is not so limited. The number of the retaining portions 1026 may be determined according to practical applications. The three retaining portions 1026 are disposed with respect to the first guiding rail 1020, the second guiding rail 1022 and the side wall 1024, respectively. During assembly process, the invention may utilize the retaining portions 1026 to retain the sliding member 1048 of the sliding module 104, so as to prevent the sliding module 104 from coming off the frame body 102 due to the constant force springs 106 or other external force.

As mentioned in the above, the invention utilizes the magnetic ball to attract the guiding rail, so as to position the sliding module on the frame body. Furthermore, the sliding module can slide with respect to the frame body by rotation of the spherical bodies, so as to achieve lift function. Since the spherical bodies at opposite sides of the sliding module abut against the guiding rails at opposite sides of the frame body, the invention can keep the sliding module at a position along vertical direction stably. Moreover, since the contact between each spherical body and the guiding rail is point contact, a manufacturing tolerance can be absorbed effectively, such that there is no gap between each spherical body and the guiding rail. Accordingly, a user may get good sliding feeling. Since the structure of the invention is simple, the invention can improve the assembly efficiency of the support frame and reduce the manufacturing cost of the display device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A support frame comprising:
a frame body having a first guiding rail and a second guiding rail, the first guiding rail being opposite to the second guiding rail, the first guiding rail being made of a magnetic induction material; and
a sliding module slidably disposed on the frame body, the sliding module comprising a sliding member, a first fixing member, a second fixing member, a first cover, a second cover, a plurality of first spherical bodies and a plurality of second spherical bodies, the first fixing member and the second fixing member being fixed on opposite sides of the sliding member, the first spherical bodies being rotatably disposed on the first fixing member and the first fixing member being slidably disposed in the first guiding rail, such that the first spherical bodies rotatably abutting against the first guiding rail, the second spherical bodies being rotatably disposed on the second fixing member and the second fixing member being slidably disposed in the second guiding rail, such that the second spherical bodies rotatably abutting against the second guiding rail, all of the first spherical bodies being magnetic balls, the first cover being disposed on the first fixing member to position the first spherical bodies on the first fixing member, the second cover being fixed on the second fixing member to position the second spherical bodies on the second fixing member.

2. The support frame of claim 1, wherein the second guiding rail is made of a magnetic induction material and at least one of the second spherical bodies is a magnetic ball.

3. The support frame of claim 2, wherein all of the second spherical bodies are magnetic balls.

4. The support frame of claim 1, wherein the sliding module further comprises a plurality of third spherical bodies, the third spherical bodies rotatably abut against a side wall of the frame body, the side wall is located between the first guiding rail and the second guiding rail, at least one of the third spherical bodies is a magnetic ball, and the side wall is made of a magnetic induction material.

5. The support frame of claim 4, wherein the sliding module further comprises a third fixing member; the third spherical bodies are rotatably disposed on the third fixing member and the third fixing member is slidably disposed with respect to the side wall, such that the third spherical bodies rotatably abut against the side wall.

6. The support frame of claim 5, wherein the sliding module further comprises a third cover and the third cover is disposed on the third fixing member to position the third spherical bodies on the third fixing member.

7. The support frame of claim 4, wherein all of the third spherical bodies are magnetic balls.

8. A display device comprising:
a support frame comprising:
a frame body having a first guiding rail and a second guiding rail, the first guiding rail being opposite to the second guiding rail, the first guiding rail being made of a magnetic induction material, the second guiding rail being made of a magnetic induction material; and
a sliding module slidably disposed on the frame body, the sliding module comprising a sliding member, a plurality of first spherical bodies and a plurality of second spherical bodies, the first spherical bodies and the second spherical bodies being rotatably disposed on the sliding member, the first spherical bodies rotatably abutting against the first guiding rail, the second spherical bodies rotatably abutting against the second guiding rail, the sliding member moving together with the first spherical bodies and the second spherical bodies relative to the frame body, at least one of the first spherical bodies being a magnetic ball, the magnetic ball and the first guiding rail generating magnetic force to position the sliding module on the frame body, all of the second spherical bodies being magnetic balls; and a display unit disposed on the sliding module.

9. The display device of claim 8, wherein the sliding module further comprises a first fixing member and a second fixing member, the first fixing member and the second fixing member are disposed at opposite sides of the sliding member; the first spherical bodies are rotatably disposed on the first fixing member and the first fixing member is slidably disposed in the first guiding rail, such that the first spherical bodies rotatably abut against the first guiding rail; the second spherical bodies are rotatably disposed on the second fixing member and the second fixing member is slidably disposed in the second guiding rail, such that the second spherical bodies rotatably abut against the second guiding rail.

10. The display device of claim 9, wherein the sliding module further comprises a first cover and a second cover, the first cover is disposed on the first fixing member to position the first spherical bodies on the first fixing member, and the second cover is disposed on the second fixing member to position the second spherical bodies on the second fixing member.

11. The display device of claim 8, wherein all of the first spherical bodies are magnetic balls.

12. The display device of claim 8, wherein the sliding module further comprises a plurality of third spherical bodies, the third spherical bodies rotatably abut against a side wall of the frame body, the side wall is located between the first guiding rail and the second guiding rail, at least one of the third spherical bodies is a magnetic ball, and the side wall is made of a magnetic induction material.

13. The display device of claim 12, wherein the sliding module further comprises a third fixing member; the third spherical bodies are rotatably disposed on the third fixing member and the third fixing member is slidably disposed with respect to the side wall, such that the third spherical bodies rotatably abut against the side wall.

14. The display device of claim 13, wherein the sliding module further comprises a third cover and the third cover is disposed on the third fixing member to position the third spherical bodies on the third fixing member.

15. The display device of claim 12, wherein all of the third spherical bodies are magnetic balls.

16. A display device comprising:

a support frame comprising:
  a frame body having a first guiding rail, a second guiding rail, and a side wall between the first guiding rail and the second guiding rail, the first guiding rail being opposite to the second guiding rail, the first guiding rail being made of a magnetic induction material, the side wall being made of a magnetic induction material; and
  a sliding module slidably disposed on the frame body, the sliding module comprising a sliding member, a plurality of first spherical bodies, a plurality of second spherical bodies, and a plurality of third spherical bodies, the first spherical bodies and the second spherical bodies being rotatably disposed on the sliding member, the first spherical bodies rotatably abutting against the first guiding rail, the second spherical bodies rotatably abutting against the second guiding rail, the sliding member moving together with the first spherical bodies and the second spherical bodies relative to the frame body, at least one of the first spherical bodies being a magnetic ball, the magnetic ball and the first guiding rail generating magnetic force to position the sliding module on the frame body, the third spherical bodies rotatably abutting against the side wall, at least one of the third spherical bodies being a magnetic ball; and a display unit disposed on the sliding module.

* * * * *